United States Patent
Hiramatsu et al.

(10) Patent No.: US 8,212,589 B2
(45) Date of Patent: Jul. 3, 2012

(54) CIRCUIT, APPARATUS, AND METHOD FOR SIGNAL TRANSFER

(75) Inventors: Akihiro Hiramatsu, Kanagawa (JP); Yutaka Saeki, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 239 days.

(21) Appl. No.: 12/783,159

(22) Filed: May 19, 2010

(65) Prior Publication Data

US 2011/0001516 A1 Jan. 6, 2011

(30) Foreign Application Priority Data

Jul. 6, 2009 (JP) .................................. 2009-159620

(51) Int. Cl.
*H03K 5/22* (2006.01)
(52) U.S. Cl. .......................................... 327/65; 327/52
(58) Field of Classification Search .................. 327/52, 327/65
See application file for complete search history.

(56) References Cited

U.S. PATENT DOCUMENTS

| | | | | |
|---|---|---|---|---|
| 5,430,765 A | * | 7/1995 | Nagahori | 375/318 |
| 5,933,459 A | * | 8/1999 | Saunders et al. | 375/317 |
| 7,586,336 B2 | * | 9/2009 | Blum | 327/63 |
| 7,747,807 B2 | * | 6/2010 | Komatsu et al. | 710/301 |
| 7,800,970 B2 | * | 9/2010 | Hong et al. | 365/208 |
| 7,994,807 B1 | * | 8/2011 | Koh et al. | 324/750.3 |
| 2008/0100347 A1 | | 5/2008 | Uchiki | |

FOREIGN PATENT DOCUMENTS

JP  2008-113196  5/2008

* cited by examiner

*Primary Examiner* — Lincoln Donovan
*Assistant Examiner* — William Hernandez
(74) *Attorney, Agent, or Firm* — Young & Thompson

(57) ABSTRACT

A signal transfer circuit according to the present invention includes a differential signal generation unit that generates a differential signal according to a voltage difference between two input signals, a voltage difference detection unit that detects a voltage difference between the two input signals input to the differential signal generation unit, and a signal output unit that outputs a signal including a predetermined value if the voltage difference is not detected by the voltage difference detection unit, and outputs the differential signal generated by the differential signal generation unit if the voltage difference is detected by the voltage detection unit.

5 Claims, 9 Drawing Sheets

CIRCUIT, APPARATUS, AND METHOD FOR SIGNAL TRANSFER

INCORPORATION BY REFERENCE

This application is based upon and claims the benefit of priority from Japanese patent application No. 2009-159620, filed on Jul. 6, 2009, the disclosure of which is incorporated herein in its entirety by reference.

BACKGROUND

1. Field of the Invention

The present invention relates to a signal transfer circuit, a signal transfer apparatus, and a signal transfer method, and particularly to a signal transfer circuit that transfers a differential signal, a signal transfer apparatus including the signal transfer circuit, and a signal transfer method using the signal transfer circuit.

2. Description of Related Art

In the field of mobile terminals or the like, there are demands for reducing the number of necessary wires as much as possible in order to realize the miniaturization of devices. Therefore, the number of wires is reduced by serializing the parallel data. If data is serialized, the speed to transfer data must be increased. Thus the interface capable of high-speed communication by a differential signal is used. The differential signal is composed of a pair of complementary signals. One of the signals is set to a high level, and the other is set to a low level relative to a reference potential. Since a signal amplitude of the differential signal can be doubled as compared to when transferring one signal, the differential signal is used as a transmission signal in high-speed digital communication. On the other hand, the current consumption in high-speed communication continues to increase. Especially in the field of mobile terminals, the problem is to suppress the power consumption.

Therefore, there is a method under consideration that in the mode with a large amount of transfer data, a differential signal transmission is used, while in the mode with a small amount of transfer data, single-ended transmission that consumes little power and communicates with one transmission wire to transmit data is used.

The outline of the operation of switching the transmission mode in case two kinds of signals are supplied, which are a single-ended and a differential signals, is described with reference to FIG. 9.

FIG. 9 illustrates time T1, in which a single-ended signal is output in response to a CMOS signal input from two external terminals, and time T3 in which a differential signal is generated in response to two input signals. Further, the transmission is switched from the single-ended signal transmission to the differential signal transmission in time T2 by a received voltage level switch signal. Either a high or low level value is set to the voltage level. Blanking time is provided in which a low level value is set to both of the two input signals and a differential signals is received. In the blanking time, there is no voltage difference between the two input signals. The time T2 and the blanking time indicate the same period.

Further, Japanese Unexamined Patent Application Publication No. 2008-113196 discloses a signal detection circuit that detects a differential signal with a minute amplitude. Specifically, the signal detection circuit can determine that no-signal state generated by an abnormal state of a data transmission path is different from the state in which there is a signal having a minute amplitude generated at the time of differential signal transmission. When the signal detection circuit determines that it is the no-signal state, an abnormal detection process is performed.

SUMMARY

The present inventor has found that when two kinds of input signals, which are a single-ended and a differential signals, dynamically switch according to a received voltage level switch signal, the following problem is generated.

A voltage difference is not generated in the input signals in the blanking time, in which the received voltage level switch signal indicates the differential mode (high level), and a differential signal is not received yet. This is because that at the time of switching from the single-ended signal with a high voltage level to a differential signal with a low voltage level, a low level signal is input as the input signals in the blanking time in order to avoid a failure in the signal receive circuit, which is caused by a voltage difference.

Then the differential signal receive block, which operates on the assumption that a voltage difference is generated in the input signals, cannot detect a voltage difference. Therefore, differential signal receive block outputs an unspecified value dependent on the module, thereby leading to a malfunction of the circuit.

A first exemplary aspect of the present invention is a signal transfer circuit that includes a differential signal generation unit that generates a differential signal according to a voltage difference between two input signals, a voltage difference detection unit that detects a voltage difference between the two input signals input to the differential signal generation unit, and a signal output unit that outputs a signal including a predetermined value when the voltage difference is not detected by the voltage difference detection unit, and outputs the differential signal generated by the differential signal generation unit when the voltage difference is detected by the voltage detection unit.

A second exemplary aspect of the present invention is a signal transfer apparatus that includes a signal transfer circuit having a differential signal generation unit that generates a differential signal according to a voltage difference between two input signals, a voltage difference detection unit that detects a voltage difference between the two input signals input to the differential signal generation unit, and a signal output unit that outputs a signal including a predetermined value when the voltage difference is not detected by the voltage difference detection unit, and outputs the differential signal generated by the differential signal generation unit when the voltage difference is detected by the voltage detection unit. Further, the signal transfer apparatus includes a single-ended signal generation unit that generates a single-ended signal according to at least one signal, and a signal switch unit that switches to one of a differential signal generated by the signal transfer circuit and a single-ended signal generated by the single-ended signal generation unit and outputs a signal.

A third exemplary aspect of the present invention is a method of signal transfer that includes obtaining two input signals, generating a differential signal according to a voltage difference between the two input signals, detecting whether there is a voltage difference between the two input signals, and outputting a signal including a predetermined value when the voltage difference is not detected and outputs the differential signal when the voltage difference is detected By controlling output signals according to whether there is a voltage difference or not, it is possible to prevent from propagating signals generated by a malfunction of the circuit to peripheral circuits.

The present invention can provide a signal transfer circuit, a signal transfer apparatus, and a signal transfer method that can prevent a malfunction of a circuit.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

The first and second exemplary embodiments can be combined as desirable by one of ordinary skill in the art.

[First Exemplary Embodiment]

Figure 1:
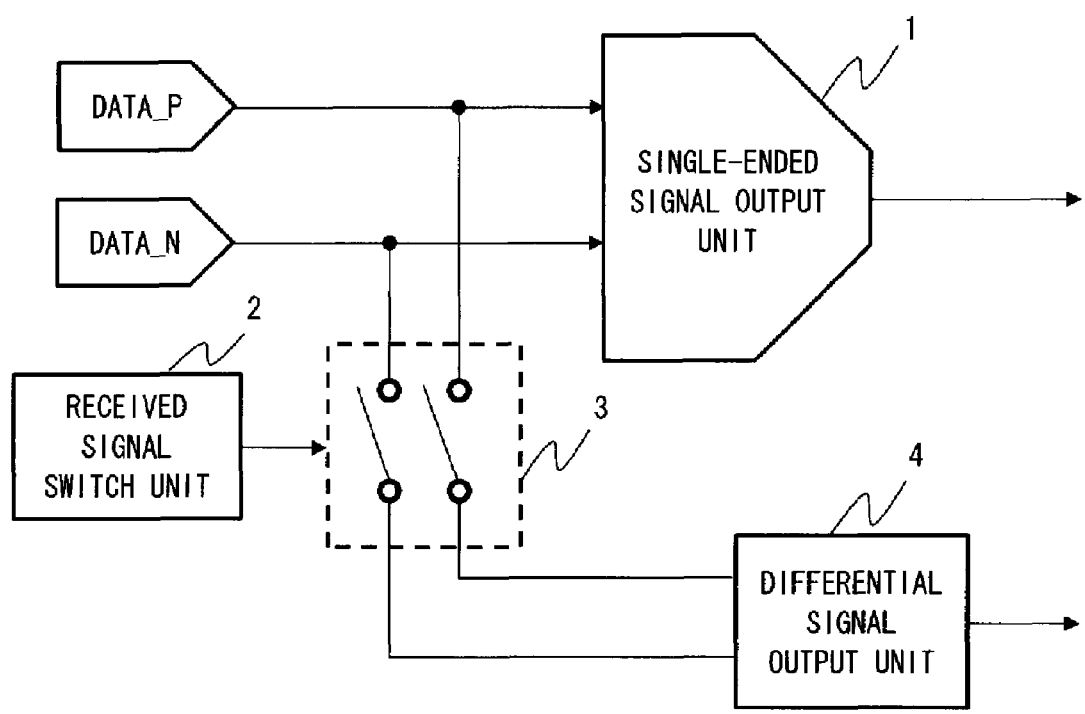
FIG. 1 is a block diagram of a signal transfer apparatus according to a first exemplary embodiment.

Hereinafter, exemplary embodiments of the present invention are described with reference to the drawings. A configuration example of a signal transfer apparatus according to the first exemplary embodiment of the present invention is described with reference to FIG. 1.

Figure 2:
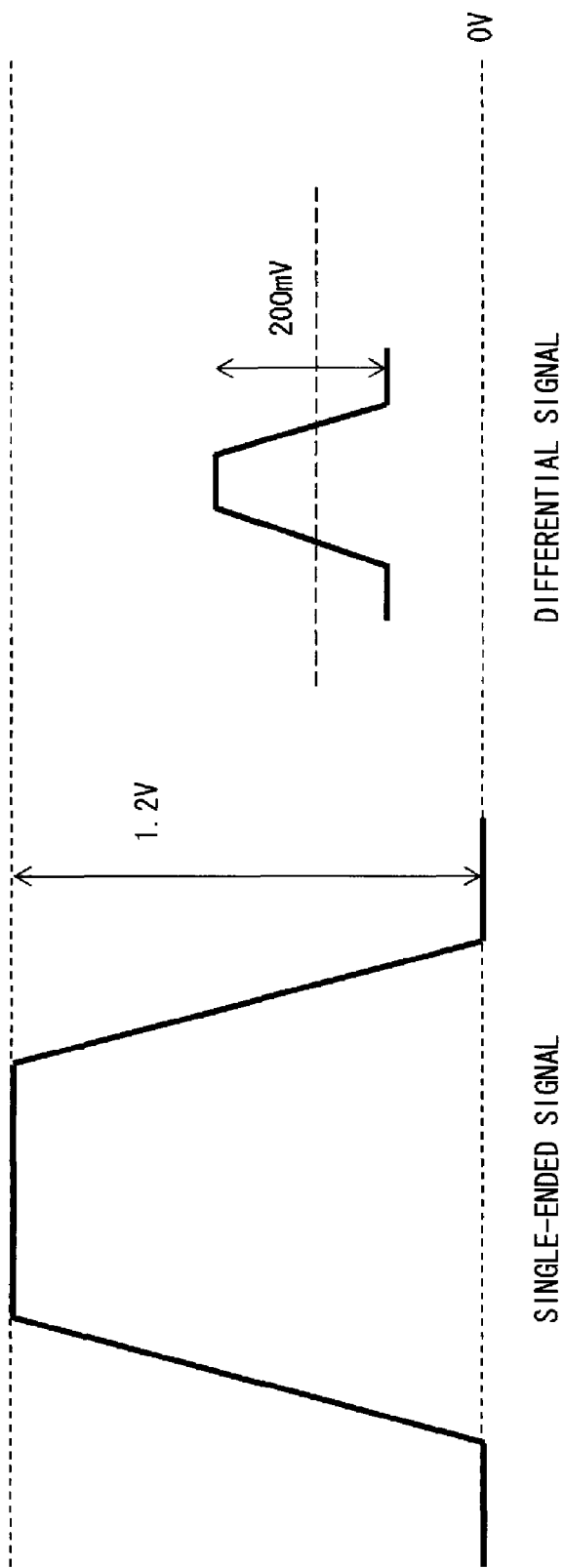
FIG. 2 illustrates amplitudes of a single-ended signal and a differential signal according to the first exemplary embodiment.

The signal transfer apparatus is provided with a single-ended signal output unit 1, a received signal switch unit 2, a switch 3, and a differential signal output unit 4. The single-ended signal output unit 1 receives at least one of Data_P and Data_N, which are received from two input terminals. As for the input signals, a voltage value equal or more than particular value is determined to be a high level, and a voltage value less than the particular value is determined to be a low level. The single-ended signal output unit 1 outputs a specified binary signal to another apparatus. The amplitudes of a single-ended and a differential signals are explained referring to FIG. 2. The single-ended signal has an amplitude value of 1.2V with reference to 0V. One of the pair of complementary signals used for the differential signal has an amplitude value of 200 mV. Thus, the amplitude value of the single-ended signal is larger than the signal used for the differential signal.

The received signal switch unit 2 switches between the single-ended signal transmission and the differential signal transmission. For example, when there is small transfer data amount, which is the amount of the Data_P and Data_N, the received signal switch unit 2 may switch to the single-ended signal transmission. When there is large transfer data amount, the received signal switch unit 2 may switch to the differential signal transmission which is capable of high-speed transmission. When the signal reception method is determined, the received signal switch unit 2 switches the switch 3. In order to receive signals in the differential signal transmission, the received signal switch unit 2 closes the switch 3, so that the Data_P and Data_N is output to the differential signal output unit 4.

The differential signal output unit 4 outputs the binary signal specified according to the two obtained signals. A configuration example of the differential signal output unit 4 is described later.

Figure 3:
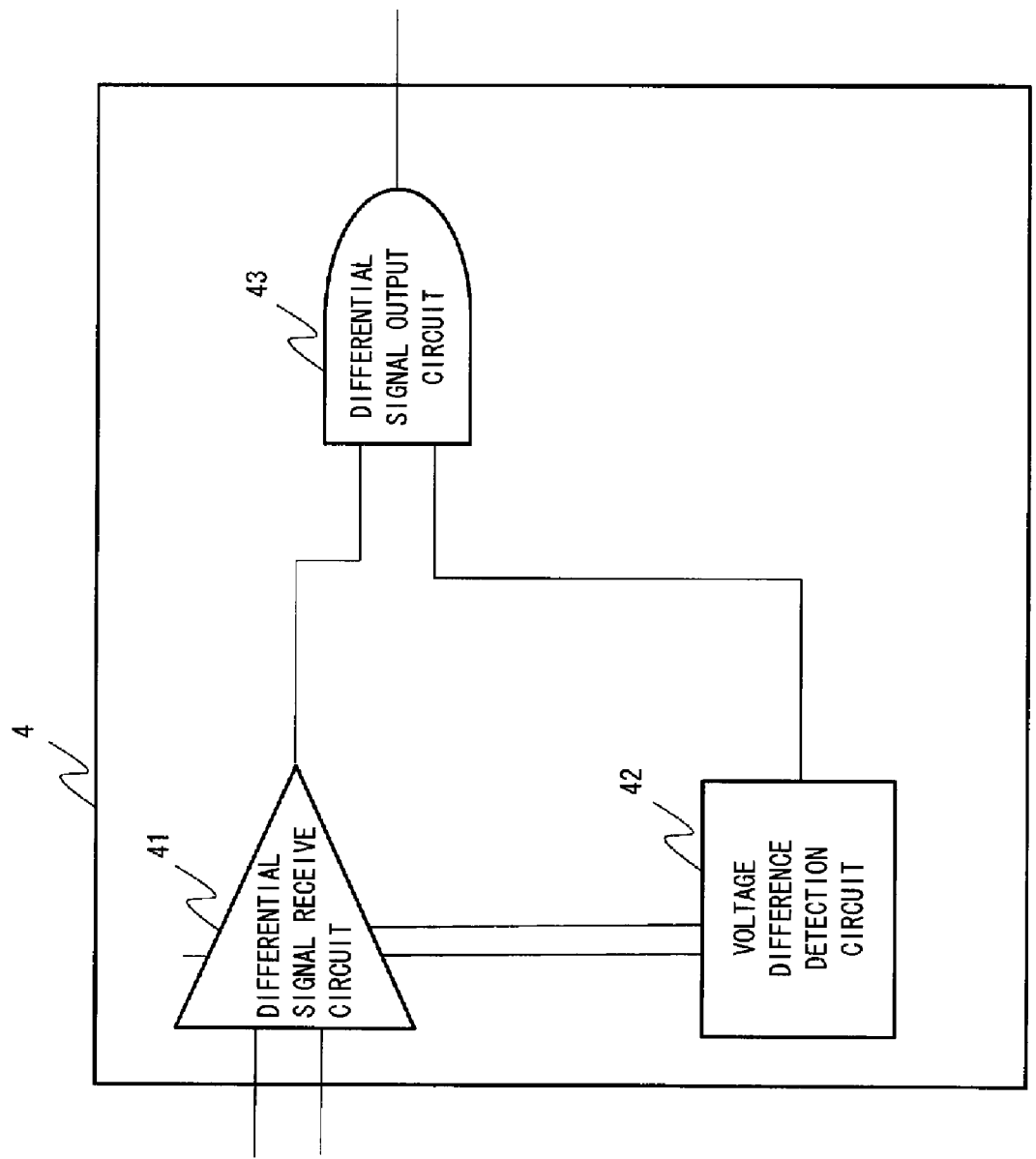
FIG. 3 is a block diagram of a differential signal output unit according to the first exemplary embodiment.
Figure 4:
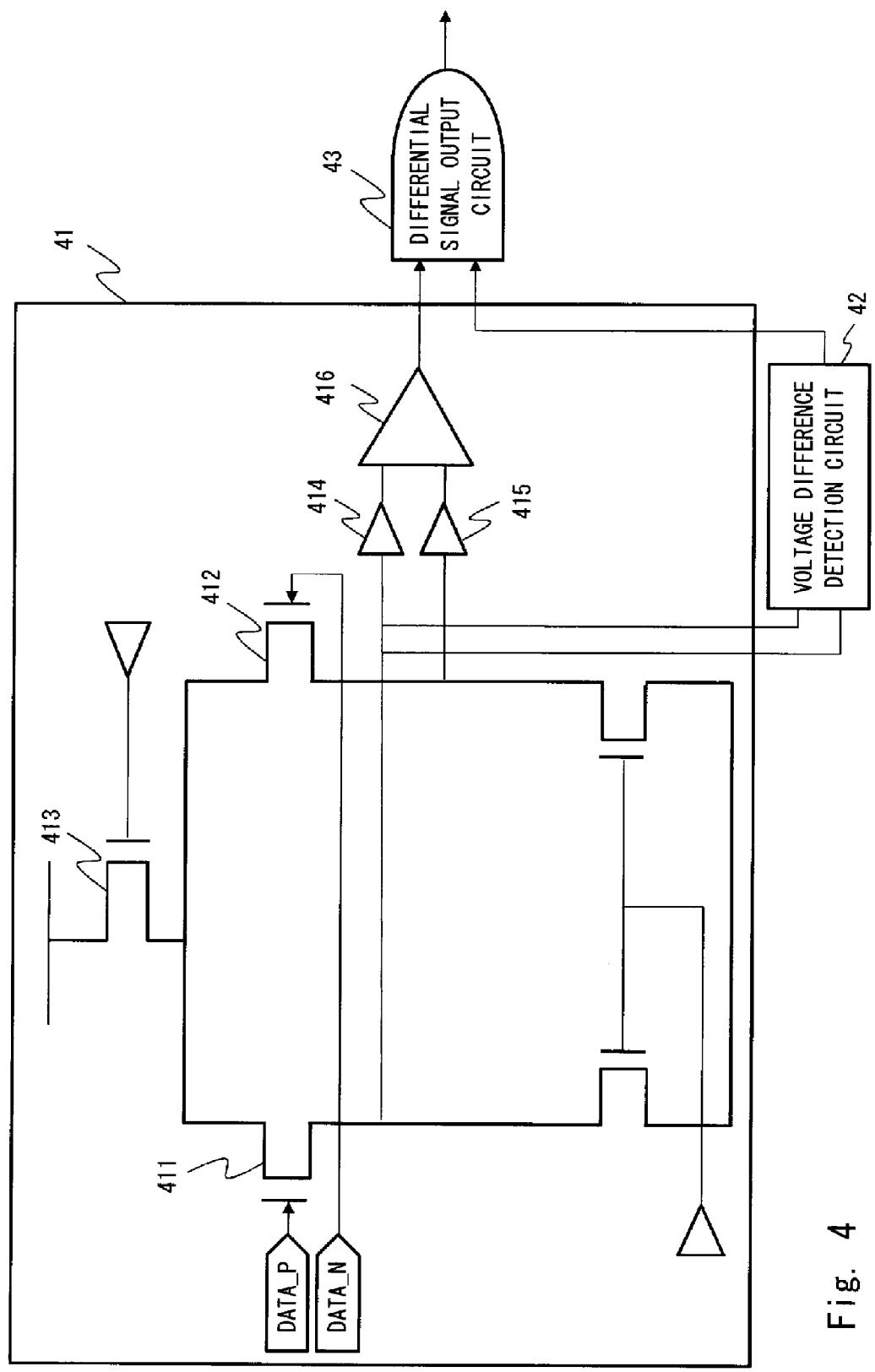
FIG. 4 is a block diagram of a differential signal receive unit according to the first exemplary embodiment.

Next, a circuit configuration example of the differential signal output unit 4 according to the first exemplary embodiment is described with reference to FIG. 3. The differential signal output unit 4 is provided with a differential signal receive circuit 41, a voltage difference detection circuit 42, and a differential signal output circuit 43. The configuration of the differential signal receive circuit 41 is explained in detail with reference to FIG. 4.

The differential signal receive circuit 41 is provided with transistors 411 and 412, a constant current source 413, buffers 414 and 415, and a comparator 416. A high voltage and a low voltage are alternately set to the transistor 411 by the Data_P. The high and low voltages are determined with reference to a particular threshold. A voltage higher than the threshold is determined to be a high voltage, and a voltage lower than the threshold is determined to be a low voltage. A high voltage and a low voltage are alternately set also to the transistor 412 by the Data_N. When a high voltage is set to the Data_P, which is input to the transistor 411, a low voltage is set to the Data_N, which is input to the transistor 412. When a low voltage is set to the Data_P, which is input to the transistor 411, a high voltage is set to the Data_N, which is input to the transistor 412. When a high voltage is set to the Data_P, the current flowing from the constant current source 413 passes through the transistor 411, the buffer 414, and an internal resistor of the comparator 416, and flows into the buffer 415. Then the potential of the input terminal on the buffer 414 side becomes higher than the input terminal on the buffer 415 side, thus the comparator 416 outputs a signal having a high level value that indicates a high voltage. When a high voltage is set to the Data_N, the current flowing from the constant current source 413 passes through the transistor 412, the buffer 415, and an internal resistance of the comparator 416, and flows into the buffer 414. Then the potential of the input terminal by the buffer 415 side becomes higher than the input terminal by the buffer 414 side, thus the comparator 416 outputs a signal set to a low level value, which indicates a low voltage. By switching the voltage set to the input signal to the transistor, the comparator 416 alternately outputs a signal set to a high level value indicating a high voltage and a signal set to a low level value indicating a low level to the differential signal output circuit 43 and generates a differential operation.

Both the Data_P and Data_N are set to a low level value indicating a low voltage value immediately after the transmission is switched from the single-ended signal transmission to the differential signal transmission. As the differential signal receive circuit 41 operates on the assumption of receiving signals set to different voltage values, in case of receiving signals with the same level voltage values, the differential signal receive circuit 41 outputs an unspecified value dependant on the module. The unspecified value indicates that signals set to a high or low level voltage value is switched irregularly and output.

Figure 5:
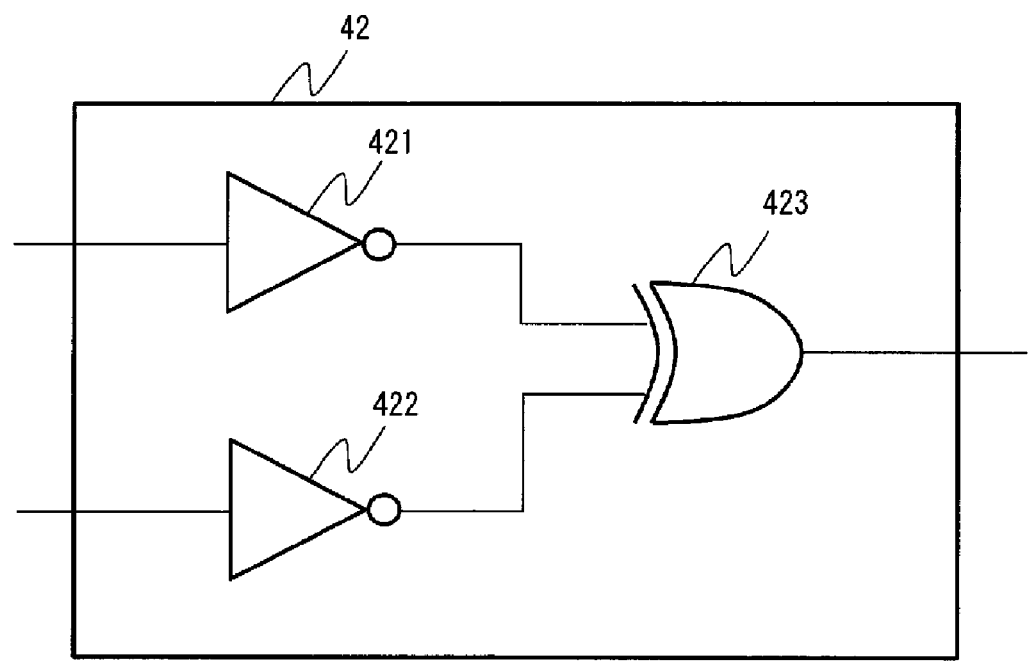
FIG. 5 is a block diagram of a voltage difference detection circuit according to the first exemplary embodiment.

The voltage difference detection circuit 42 detects a voltage difference between the two signal input to the differential signal receive circuit 41, and outputs the voltage difference to the differential signal output circuit 43. The voltage difference detection circuit 42 is connected so as to detect a voltage difference between signals that are already input to the transistors 411 and 412. The configuration of the voltage difference detection circuit 42 is explained in detail with reference to FIG. 5.

The voltage difference detection circuit 42 is provided with NOT circuits 421 and 422 for performing NOT operations, and an EX-OR (Exclusive OR) circuit 423 for performing exclusive OR operations. The flow of a signal is explained in detail hereinafter. When the signals set to a low level are respectively input to the NOT circuits 421 and 422, a signal set to a high level value is input to the EX-OR operational circuit 423. The EX-OR operational circuit 423 obtains the signal set to a high level value from the NOT circuits 421 and 422, and then outputs a signal set to a low level value. When the signal set to a high level value is input to the NOT circuits 421 and 422, the EX-OR operational circuit 423 obtains a signal set to a low level value, and outputs the signal set to a low level value. Further, when a signal set to a high level value is input to either of the NOT circuit 421 or 422, and a signal set to a low level value is input to the other one, the EX-OR operational circuit 423 outputs a signal set to a high level value.

The differential signal output circuit 43 obtains the signal set to a high or low level value from the differential signal receive circuit 41 and the voltage difference detection circuit 42. The status immediately after the transmission is switched from the single-ended signal transmission to the differential signal transmission is explained hereinafter.

Immediately after the transmission is switched from the single-ended signal transmission to the differential signal transmission, a signal indicating that a low level value is set to both of the Data_P and Data_N is input to the differential signal receive circuit 41 and the voltage difference detection circuit 42. Then the differential signal receive circuit 41 outputs an unspecified value. The voltage difference detection circuit 42 outputs a signal set to a low level indicating that there is no voltage difference to the differential signal output circuit 43. The differential signal output circuit 43 is composed of an AND circuit which performs AND operations. In case of obtaining a signal set to a low level, the differential signal output circuit 43 outputs a signal set to a low level value regardless of the value of the other signal.

Then, even if an unspecified value is set to the signal output from the differential signal receive circuit 41, the differential signal output circuit 43 outputs a signal set to a low level value.

Next, a case is explained, in which a signal indicating that a high level value is set to one of the Data_P and Data_N, and a low level value is set to the other one is input to the differential signal receive circuit 41 and the voltage difference detection circuit 42. When a high level value is set to the Data_P, and a low level value is set to the Data_N, the differential signal receive circuit 41 outputs a signal set to a high level value to the differential signal output circuit 43. Moreover, the voltage difference detection circuit 42, which has obtained two signals set to high and low level values, outputs a signal set to a high level value indicating that there is a voltage difference between the signals. The differential signal output circuit 43, which has also obtained the signal set to a high level value, outputs a signal set to a high level value.

When a low level value is set to the Data_P, and a high level value is set to the Data_N, the differential signal receive circuit 41 outputs a signal set to a low level value to the differential signal output circuit 43. The voltage difference detection circuit 42 outputs a signal set to a high level value indicating that there is a voltage difference. The differential signal output circuit 43 outputs a signal set to a low level value in order to obtain signals set to high and low level values.

Then, when the differential signal receive circuit 41 obtains two input signals having a voltage difference, the differential signal output circuit 43 can set a specified value to an output signal from the differential signal receive circuit 41.

Figure 6:
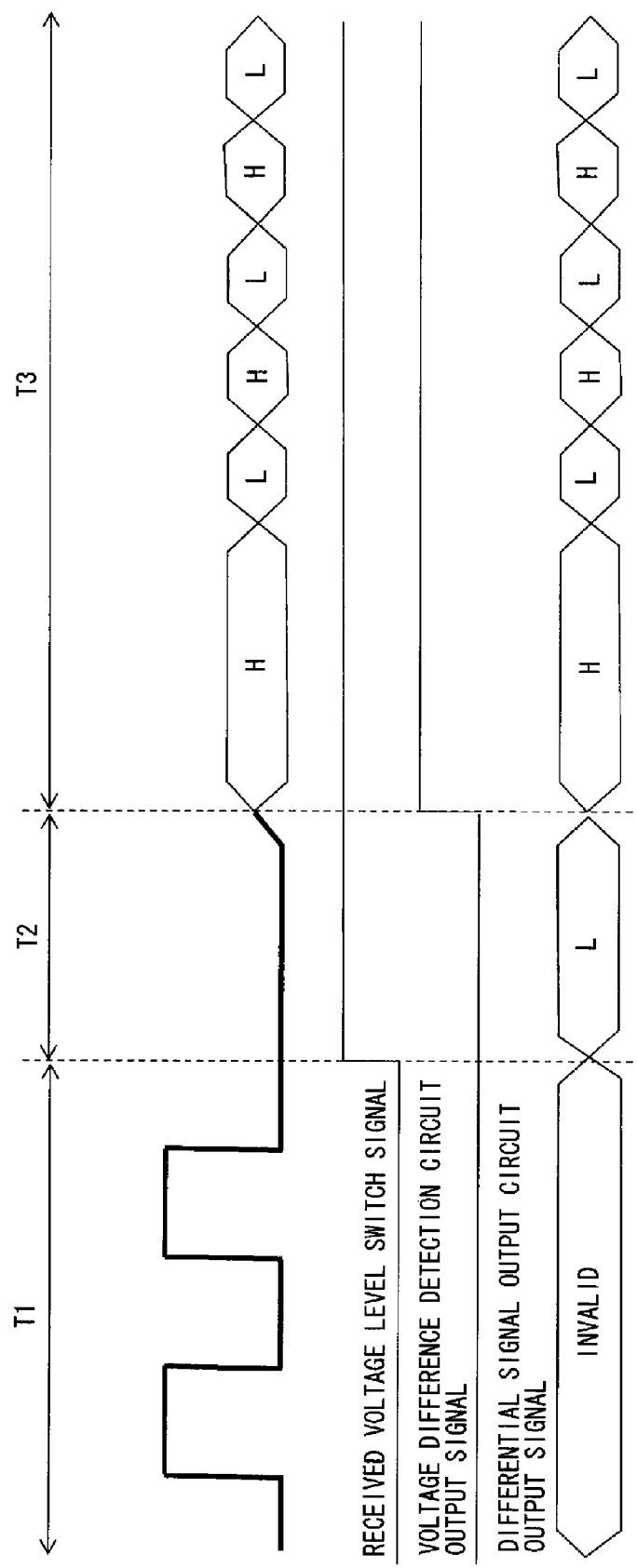
FIG. 6 is a waveform chart of input and output signals in the signal transfer apparatus according to the first exemplary embodiment.

Next, the waveform chart of the signal transfer circuit according to the first exemplary embodiment of the present invention is explained with reference to FIG. 6. The time T1 indicates single-ended signal receive time, the time T2 indicates blanking time, and the time T3 indicates differential signal receive time.

As a received voltage level switch signal selects the single-ended signal transmission during the time T1, a low level value is set to the received voltage level switch signal. The received voltage level switch signal switches to the differential signal transmission during the time T2 and T3, thus a high level value is set to the received voltage level switch signal.

The voltage difference detection circuit output signal is in the single-ended signal transmission during the time T1, and there is no voltage difference detected in the differential signal. Thus a low level value is set to the voltage difference detection circuit output signal during the time T1. During the time T2, which is the blanking time and a low level value is set to the two input signals, a voltage difference is not detected. Then a low level value is set to the voltage difference detection circuit output signal. During the time T3, a high level value is set to one of the two input signals and a low level value is set to the other signal. Thus a voltage difference is detected and a high level value is set to the voltage difference detection circuit output signal.

During the time T1, the differential signal output circuit output signal is in the single-ended signal transmission, thus no value is set. During the blanking time of the time T2, there is no voltage difference generated in the input signals, thus a low level value, which is a predetermined value, is set to the differential signal output circuit output signal. During the time T3, a value output from the differential signal receive circuit 41 is set to the differential signal output circuit output signal.

As explained above, the signal transfer circuit according to the first exemplary embodiment of the present invention detects whether there is a voltage difference in the input signals after transitioning from the single-ended signal to the differential signal mode. When a voltage difference more than a predetermined value cannot be obtained, a fixed value is output in order not to propagate an unspecified value output from the differential signal receive circuit to the peripheral circuits. This enables to prevent a malfunction in the peripheral circuits.

[Second Exemplary Embodiment]

Figure 7:
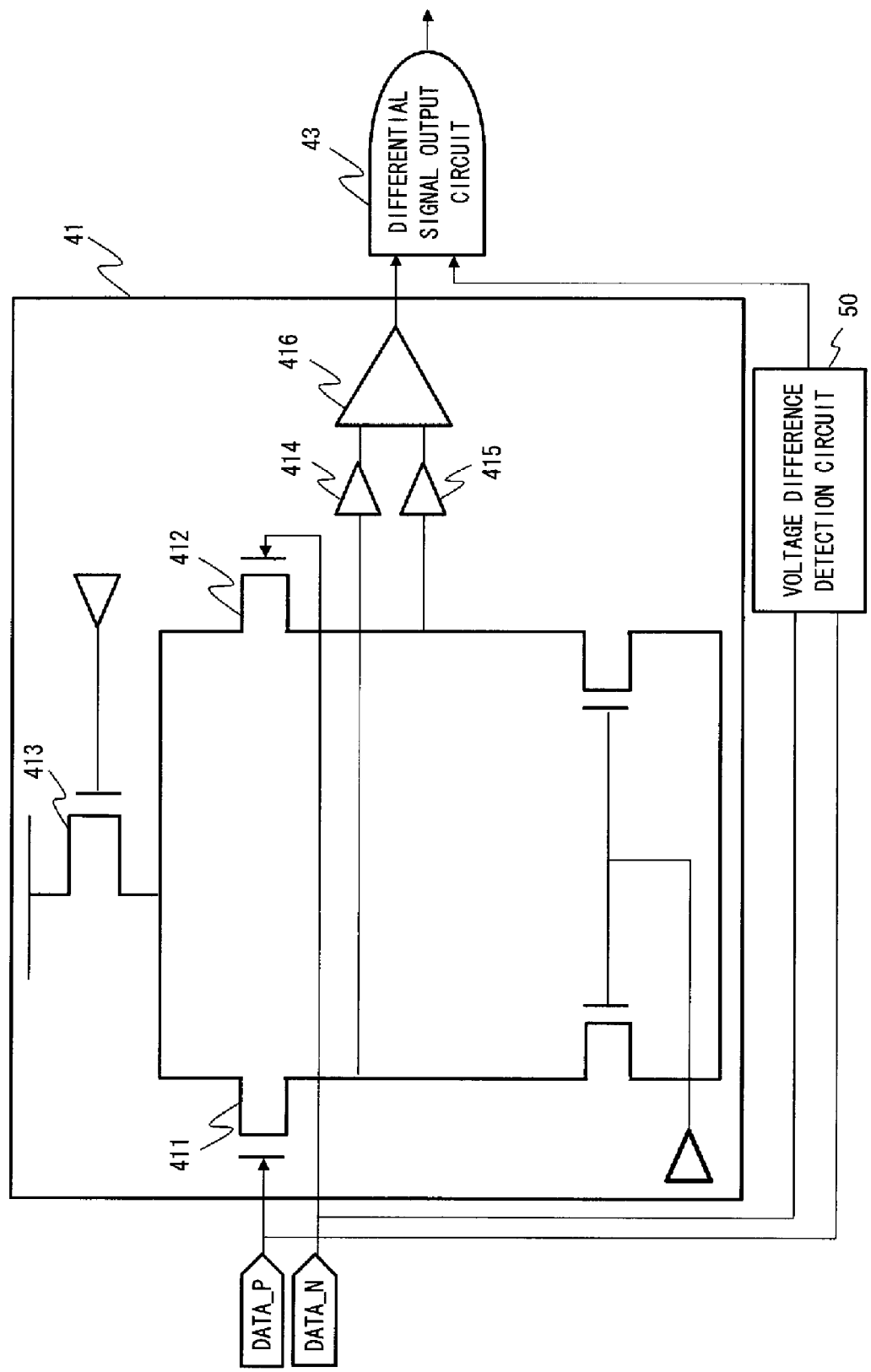
FIG. 7 is a block diagram of a differential signal receive circuit according to a second exemplary embodiment.

FIG. 7 illustrates a circuit configuration example of the differential signal output unit 4 according to the second exemplary embodiment of the present invention. In the circuit configuration example of FIG. 7, a voltage difference detection circuit 50 is connected to the previous stage of the differential signal receive circuit 41 so as to detect a voltage difference in the input signals Data_P and Data_N, which are not yet input to the differential signal receive circuit 41. Other configuration is the same as FIG. 4.

Figure 8:
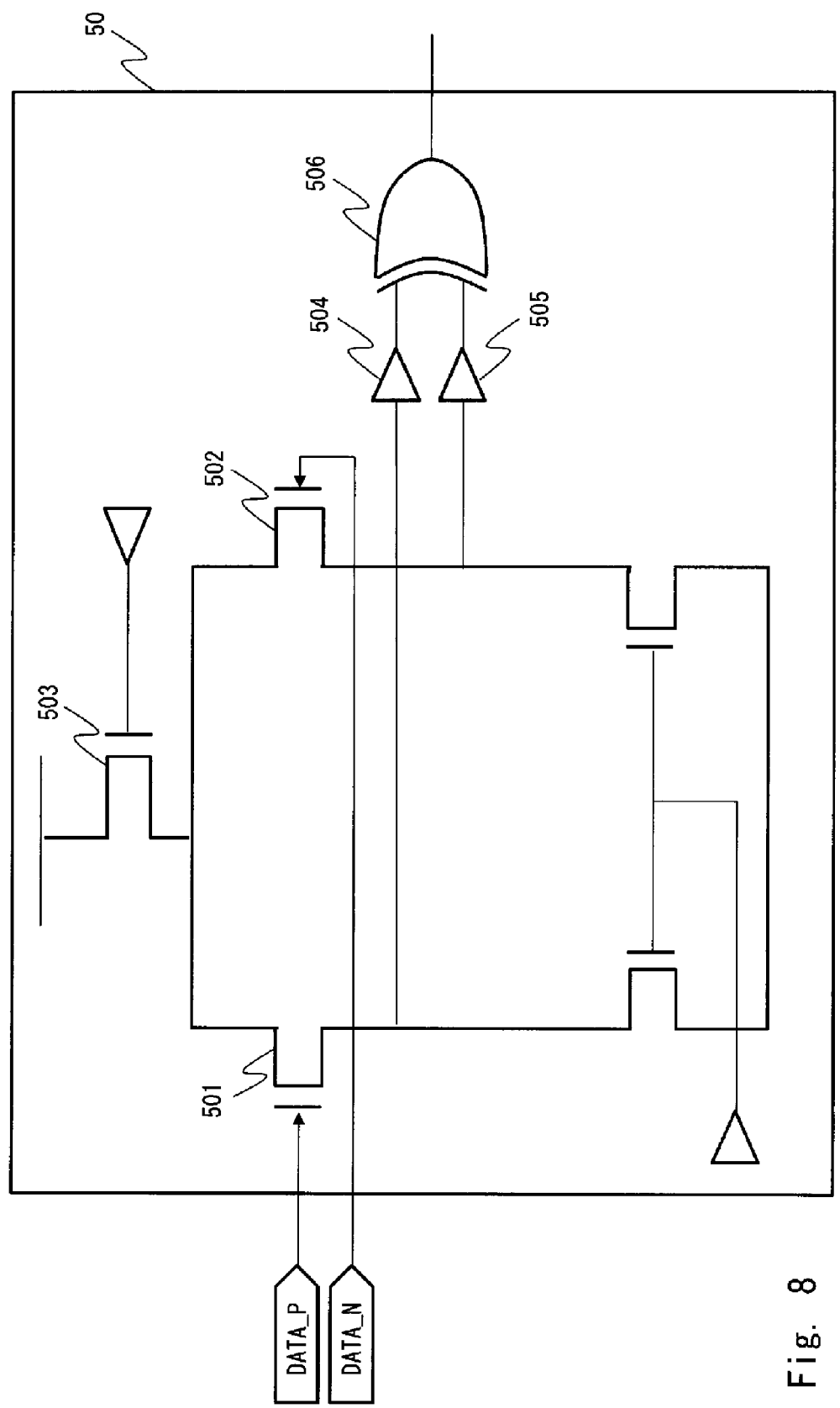
FIG. 8 is a block diagram of a voltage difference detection circuit according to the second exemplary embodiment.
Figure 9:
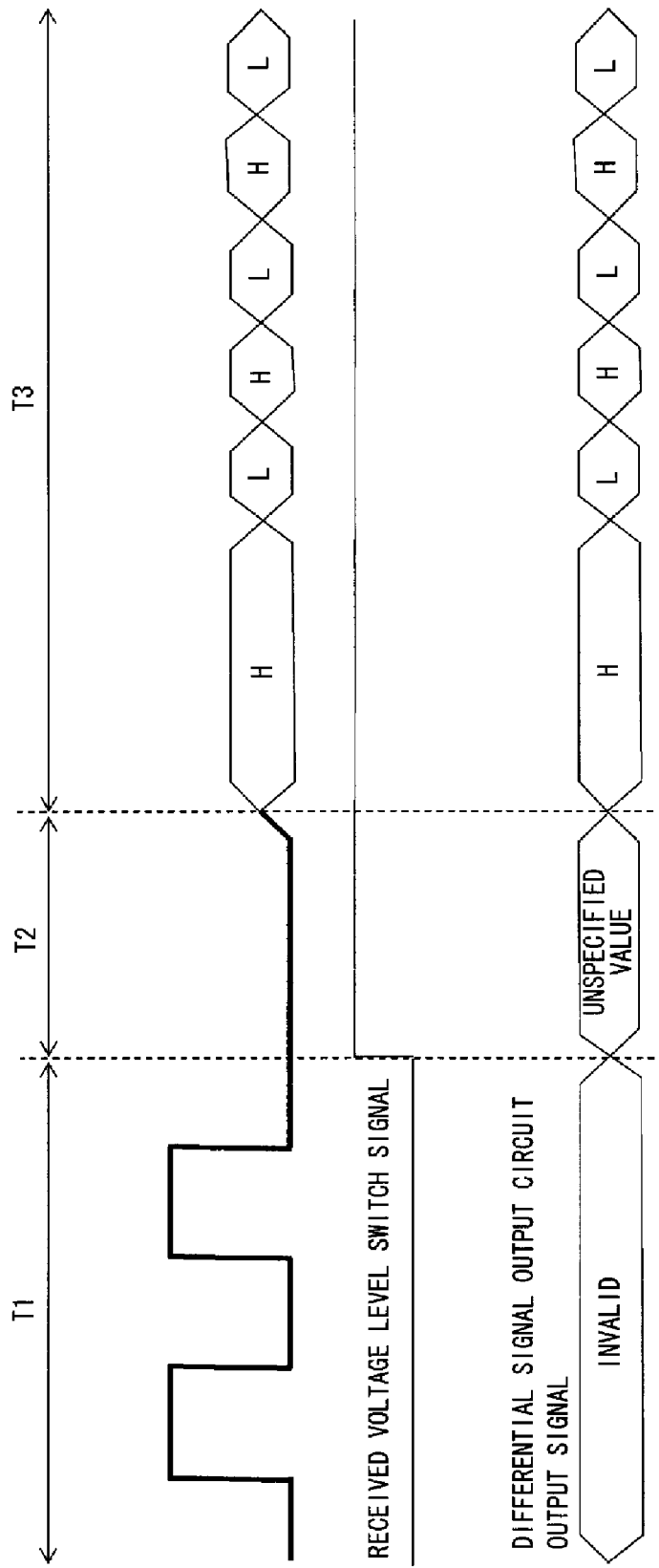
FIG. 9 is a waveform chart of input and output signals in the signal transfer apparatus according to a related art.

Next, a circuit configuration example of the voltage difference detection circuit 50 is explained with reference to FIG. 8. The voltage difference detection circuit 50 is provided with transistors 501 and 502, a constant current source 503, buffers 504 and 505, and an EX-OR operational circuit 506 in a similar manner as the differential signal receive circuit 41 of FIG. 7.

A signal is supplied from the transistors 501 and 502 provided inside the voltage difference detection circuit 50 to the buffers 504 and 505. As with FIG. 5, when there is a voltage difference between the Data_P and Data_N, the EX-OR operational circuit 506 outputs a signal set to a high level value to the differential signal output circuit 43. When there is no voltage difference between the Data_P and Data_N, the EX-OR operational circuit 506 outputs a signal set to a low level value to the differential signal output circuit 43.

This configuration enables the voltage difference detection circuit 50 to detect a voltage difference in the differential signal by a circuit that is independent of the differential signal receive circuit 41.

The present invention is not limited to the above exemplary embodiments, but may be modified within the scope of the present invention.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A signal transfer circuit comprising:
    a differential signal generation unit that generates a differential signal according to a voltage difference between two input signals;
    a voltage difference detection unit that detects a voltage difference between the two input signals, the two input signals being input to the differential signal generation unit; and
    a signal output unit that outputs a signal having a predetermined value when the voltage difference is not detected by the voltage difference detection unit, and outputs the differential signal generated by the differential signal generation unit when the voltage difference is detected by the voltage detection unit.

2. The signal transfer circuit according to claim 1, wherein when the voltage difference between the two input signals is not detected, the signal output unit converts the differential signal including an unspecified value into a signal including predetermined value and outputs the signal, the differential signal being obtained from the differential signal generation unit.

3. The signal transfer circuit according to claim 1, further comprising a received signal switch unit that switches to one of a single-ended signal transmission mode and a differential signal transmission mode and receives the two input signals;
    wherein the differential signal generation unit generates a differential signal according to the voltage difference between the two input signals when the received signal switch unit switches to the differential signal transmission mode.

4. A signal transfer apparatus comprising:
    a differential signal generation unit that generates a differential signal according to a voltage difference between two input signals;
    a voltage difference detection unit that detects a voltage difference between the two input signals, the two input signals being input to the differential signal generation unit;
    a signal output unit that outputs a signal including a predetermined value when the voltage difference is not detected by the voltage difference detection unit, and outputs the differential signal generated by the differential signal generation unit when the voltage difference is detected by the voltage detection unit
    a single-ended signal generation unit that generates a single-ended signal according to at least one signal; and
    a signal switch unit that switches to one of a differential signal generated by the differential signal generation unit and a single-ended signal generated by the single-ended signal generation unit and outputs a signal.

5. A method of signal transfer comprising:
    obtaining two input signals;
    generating a differential signal according to a voltage difference between the two input signals;
    detecting whether there is a voltage difference between the two input signals; and
    outputting a signal including a predetermined value when the voltage difference is not detected and outputs the differential signal when the voltage difference is detected.

* * * * *